(12) United States Patent
Yu et al.

(10) Patent No.: US 10,638,628 B2
(45) Date of Patent: Apr. 28, 2020

(54) NETWORK COMMUNICATION DEVICE ENCLOSURE MADE OF DIFFERENT MATERIALS

(71) Applicant: Samsung Electronics Co., Ltd., Suwon-si, Gyeonggi-do (KR)

(72) Inventors: Sangsoo Yu, Suwon-si (KR); Heewoo Lee, Suwon-si (KR); Hyunsuk Jang, Yongin-si (KR); Raehong Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/978,914

(22) Filed: May 14, 2018

(65) Prior Publication Data
US 2019/0069426 A1 Feb. 28, 2019

(30) Foreign Application Priority Data
Aug. 30, 2017 (KR) .................. 10-2017-0110087

(51) Int. Cl.
*H05K 5/04* (2006.01)
*H01R 13/52* (2006.01)
(Continued)

(52) U.S. Cl.
CPC .............. *H05K 5/04* (2013.01); *H01R 13/512* (2013.01); *H01R 13/5202* (2013.01);
(Continued)

(58) Field of Classification Search
CPC .. H05K 5/0004; H05K 5/0008; H05K 5/0247; H05K 5/061; H05K 5/06;
(Continued)

(56) References Cited

U.S. PATENT DOCUMENTS

| 4,433,093 A | * | 2/1984 | Shida | ................... C08K 3/04 428/471 |
| 4,599,484 A | * | 7/1986 | Bramwell | ............ H05K 5/0008 174/50 |

(Continued)

FOREIGN PATENT DOCUMENTS

| CN | 105525290 A | 4/2016 |
| CN | 105586590 A | 5/2016 |

(Continued)

*Primary Examiner* — Steven T Sawyer
*Assistant Examiner* — Paresh H Paghadal (57) ABSTRACT

A communication device enclosure is made of different materials. The communication device enclosure includes a first housing, a second housing, and a connector cover. The first housing is formed in a box shape and has one open face and one open lateral face adjacent to the one open face. The second housing is formed in a box shape and has one open face and one open lateral face adjacent to the one open face. The first and second housings form together an inner space for containing an electronic component. The connector cover is formed of a material different from materials of the first and second housings, is disposed on the open lateral faces of the first and second housings, and has a connector for electric connection between the electronic component and an external device. The connector cover is combined with the first and second housings to seal the inner space.

13 Claims, 10 Drawing Sheets

(51) Int. Cl.
  *H01R 13/6581* (2011.01)
  *H05K 5/00* (2006.01)
  *H05K 5/02* (2006.01)
  *H05K 7/20* (2006.01)
  *H01R 13/512* (2006.01)
  *H05K 5/06* (2006.01)
(52) U.S. Cl.
  CPC ....... *H01R 13/6581* (2013.01); *H05K 5/0008* (2013.01); *H05K 5/0247* (2013.01); *H05K 7/20409* (2013.01); *H05K 5/061* (2013.01)
(58) Field of Classification Search
  CPC .. H05K 5/0013; H05K 5/0052; H01R 13/512; H01R 13/5205; H01R 13/6581
  See application file for complete search history.

(56) References Cited

U.S. PATENT DOCUMENTS

| | | | | |
|---|---|---|---|---|
| 5,508,877 A * | 4/1996 | Smith | ........... | H01T 4/06 361/119 |
| 6,041,956 A * | 3/2000 | Kao | ........... | H05K 5/04 220/4.02 |
| 6,707,678 B2 * | 3/2004 | Kobayashi | ........... | H05K 5/0052 361/752 |
| 6,769,748 B1 * | 8/2004 | Tamura | ........... | H05K 5/0013 312/223.1 |
| 9,688,288 B1 * | 6/2017 | Lathrop | ........... | B60W 50/14 |
| 2001/0040037 A1 * | 11/2001 | Negishi | ........... | H05K 5/061 174/17 CT |
| 2006/0179446 A1 * | 8/2006 | Bickford | ........... | H04R 3/007 720/650 |
| 2008/0002377 A1 * | 1/2008 | Kamoshida | ........... | H05K 5/0052 361/752 |
| 2008/0180916 A1 * | 7/2008 | Wickett | ........... | H05K 5/0039 361/720 |
| 2008/0225468 A1 * | 9/2008 | Huang | ........... | H05K 9/0067 361/724 |
| 2011/0230076 A1 * | 9/2011 | Lim | ........... | H01R 9/032 439/345 |
| 2011/0235290 A1 * | 9/2011 | Luhr | ........... | H05K 3/301 361/752 |
| 2012/0069532 A1 * | 3/2012 | Azumi | ........... | H05K 5/0052 361/752 |
| 2012/0287582 A1 * | 11/2012 | Vinciarelli | ........... | H01R 43/24 361/728 |
| 2013/0063878 A1 * | 3/2013 | Kirihara | ........... | H05K 5/061 361/679.01 |
| 2013/0109010 A1 * | 5/2013 | Fujii | ........... | C07K 14/005 435/5 |
| 2014/0144666 A1 * | 5/2014 | Lisitschew | ........... | H05K 5/0004 174/50 |
| 2014/0356094 A1 * | 12/2014 | Revel | ........... | F16B 39/02 411/82.5 |
| 2015/0146347 A1 * | 5/2015 | Lee | ........... | H01R 13/5202 361/679.01 |
| 2016/0106010 A1 * | 4/2016 | Ito | ........... | H05K 7/20854 361/707 |
| 2017/0188491 A1 * | 6/2017 | Gottl | ........... | H01P 1/2053 |
| 2017/0257964 A1 * | 9/2017 | Ishikawa | ........... | H05K 5/0017 |
| 2017/0265318 A1 * | 9/2017 | Taubert | ........... | H05K 5/0073 |
| 2018/0109027 A1 * | 4/2018 | Kaneko | ........... | B60R 16/02 |
| 2018/0124939 A1 * | 5/2018 | Hung | ........... | H05K 5/0008 |

FOREIGN PATENT DOCUMENTS

| | | |
|---|---|---|
| CN | 105586598 A | 5/2016 |
| CN | 105925141 A | 9/2016 |
| CN | 106319311 A | 1/2017 |
| WO | 2015161636 A1 | 10/2015 |

* cited by examiner

NETWORK COMMUNICATION DEVICE ENCLOSURE MADE OF DIFFERENT MATERIALS

CROSS-REFERENCE TO RELATED APPLICATION

This application is based on and claims priority under 35 U.S.C. § 119 to Korean Patent Application No. 10-2017-0110087 filed on Aug. 30, 2017, in the Korean Intellectual Property Office, the disclosure of which is incorporated herein by reference in its entirety.

TECHNICAL FIELD

The present disclosure relates to a communication device enclosure installed outdoors and enclosing a network communication device.

BACKGROUND

Among communication device enclosures in which network communication devices are mounted, the communication device enclosure installed outdoors is required to have high corrosion resistance for excellent durability and high thermal conductivity for excellent heat dissipation. Further, since being usually installed on a high place, such an enclosure should be light in weight. The communication device enclosures have been developed in the direction of satisfying various requirements as described above.

The communication device enclosure for enclosing a network communication device may be generally made of a material being less susceptible to corrosion, e.g., a metallic material having high corrosion resistance, even if it is exposed to a severe environment in which the humidity is high and the variation of temperature is considerable, or even if scratches occur on a surface thereof.

Typically, the communication device enclosure is made of aluminum which has a better corrosion resistance and a lower specific gravity than those of other metals. Nevertheless, there is a continued demand for a reduction in weight of the communication device enclosure.

SUMMARY

Various embodiments of the present disclosure provide a communication device enclosure made of different materials for each part to satisfy the weight reduction and the corrosion resistance at the same time. In addition, it is possible to provide a fastening structure of a communication device enclosure for preventing the deterioration of corrosion resistance caused by abutment of parts made of different materials.

According to embodiments of the present disclosure, a communication device enclosure made of different materials may include a first housing formed in a box shape and having one open face and one open lateral face adjacent to the one open face; a second housing formed in a box shape and having one open face and one open lateral face adjacent to the one open face, wherein the first and second housings form together an inner space for containing an electronic component; and a connector cover formed of a material different from materials of the first and second housings, disposed on the open lateral faces of the first and second housings, and having a connector for electric connection between the electronic component and an external device, wherein the connector cover is combined with the first and second housings to seal the inner space.

According to embodiments of the present disclosure, it is possible to reduce the overall weight of a communication device enclosure by joining together constituent parts made of different materials. In addition, it is possible to improve corrosion resistance by structurally preventing deterioration of corrosion resistance caused by abutment of the constituent parts formed of different materials.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," etc., may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure.

The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

Figure 1:
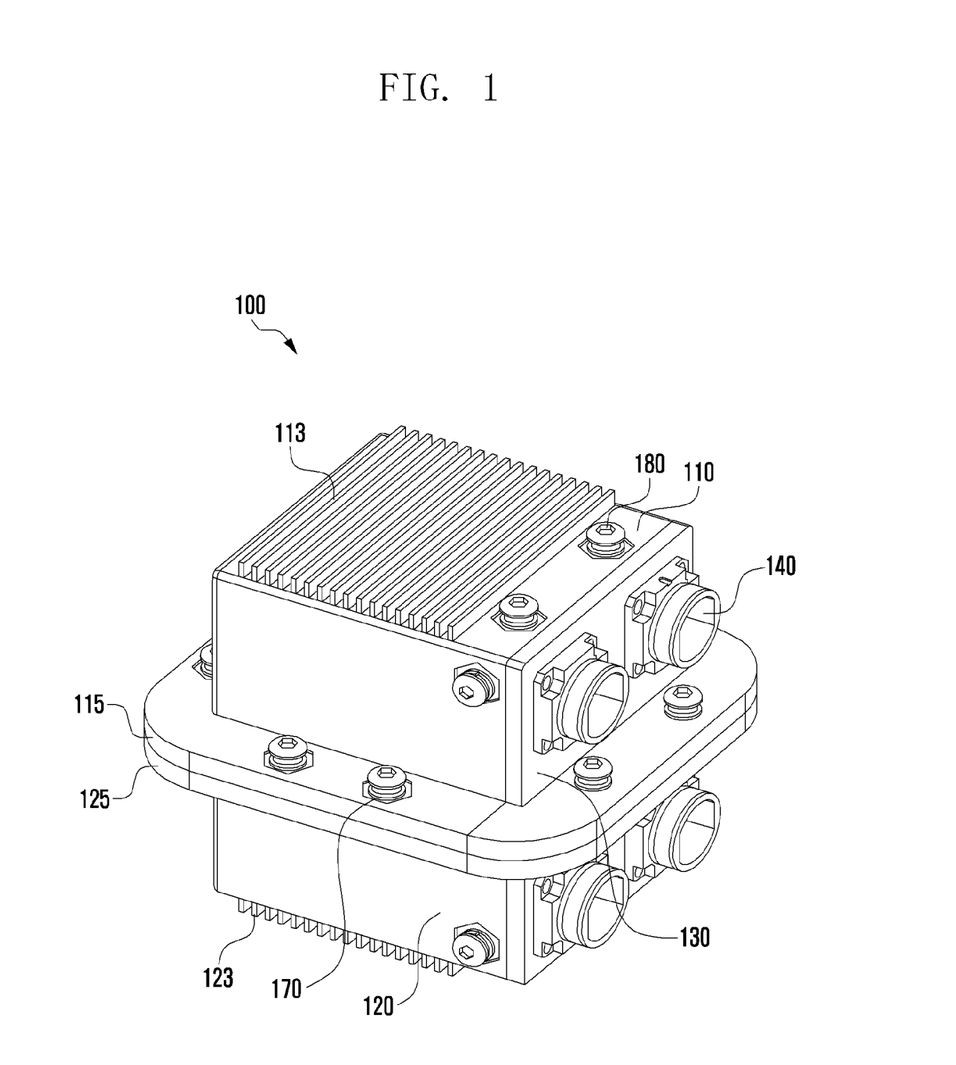
FIG. 1 is a perspective view illustrating a communication device enclosure of different materials according to one embodiment.
Figure 2:
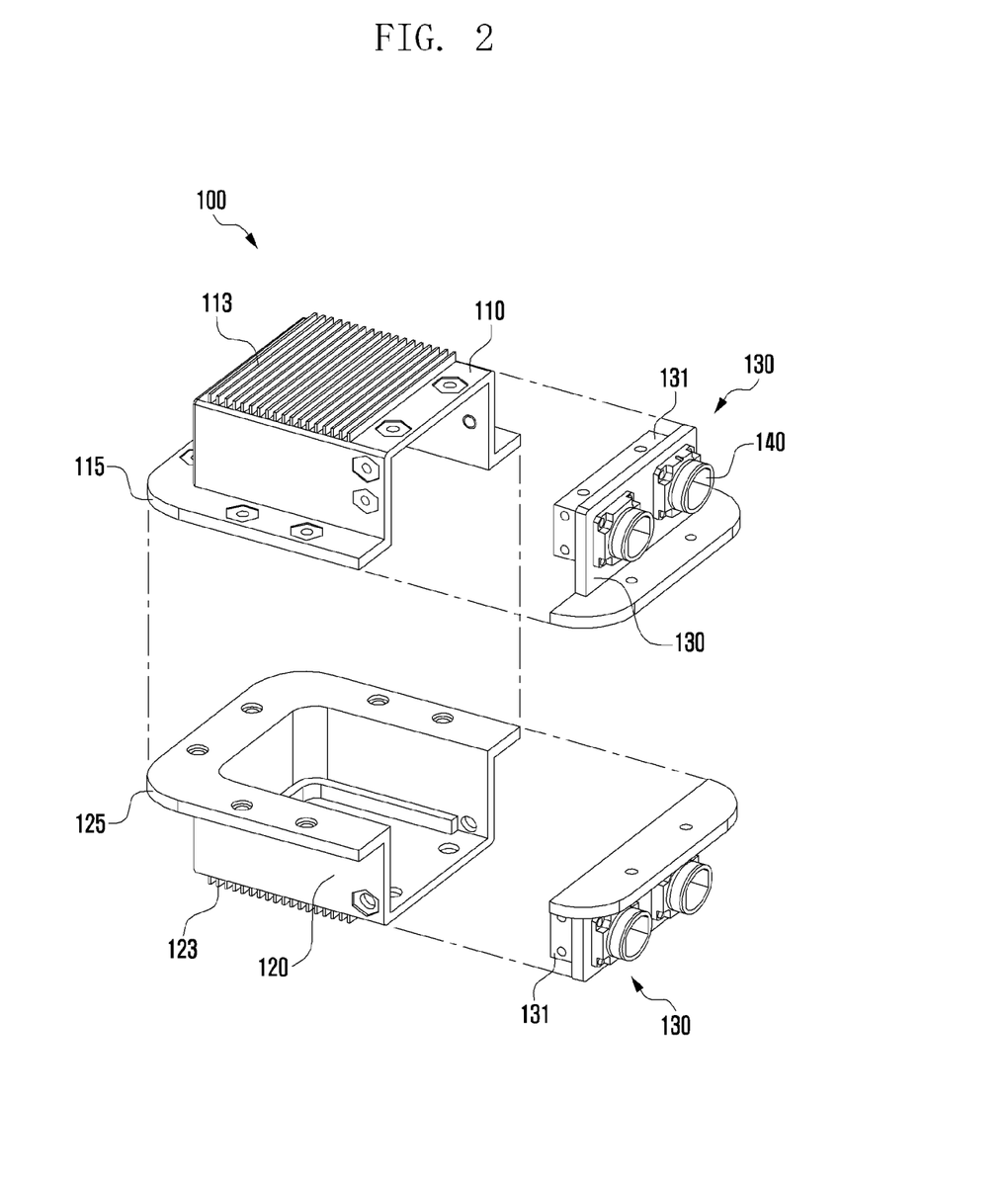
FIG. 2 is an exploded perspective view illustrating the communication device enclosure shown in FIG. 1.

FIG. 1 is a perspective view illustrating a communication device enclosure 100 of different materials according to one embodiment, and FIG. 2 is an exploded perspective view illustrating the communication device enclosure 100 shown in FIG. 1.

Figure 3:
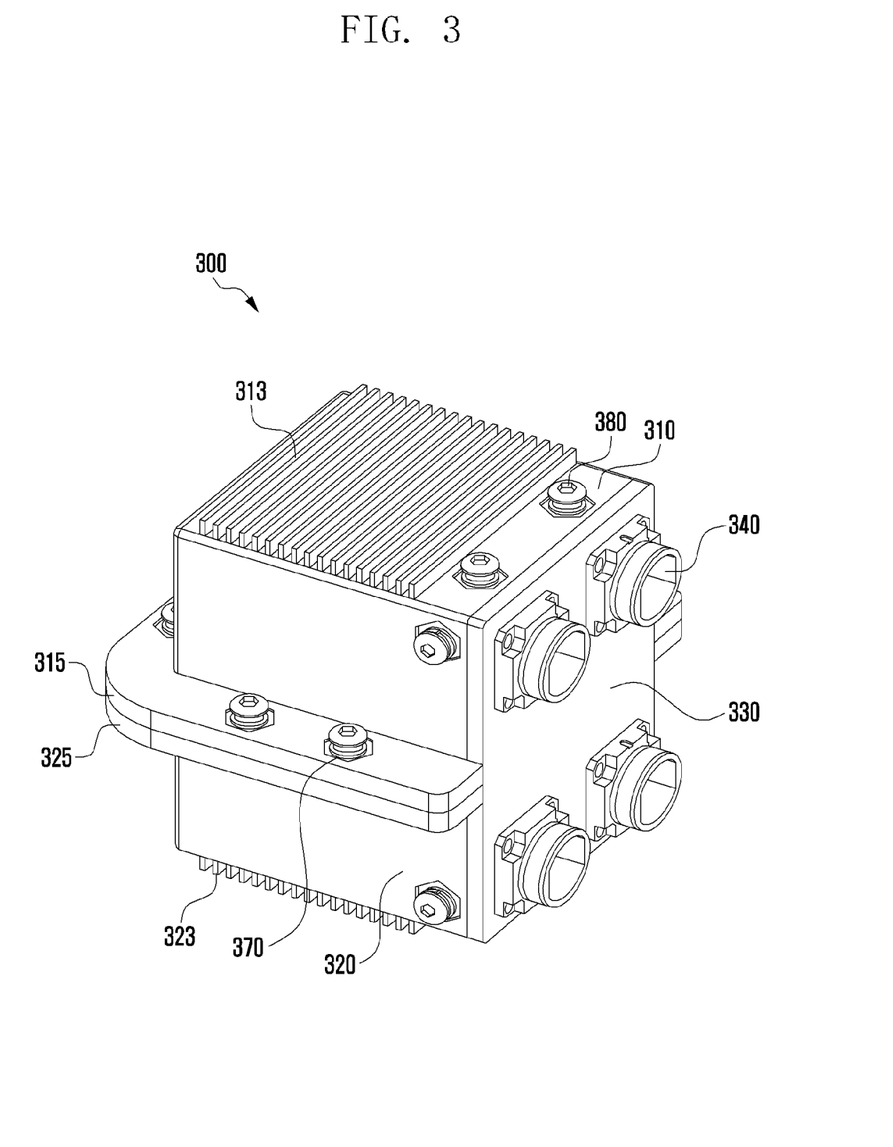
FIG. 3 is a perspective view illustrating a communication device enclosure of different materials according to another embodiment.
Figure 4:
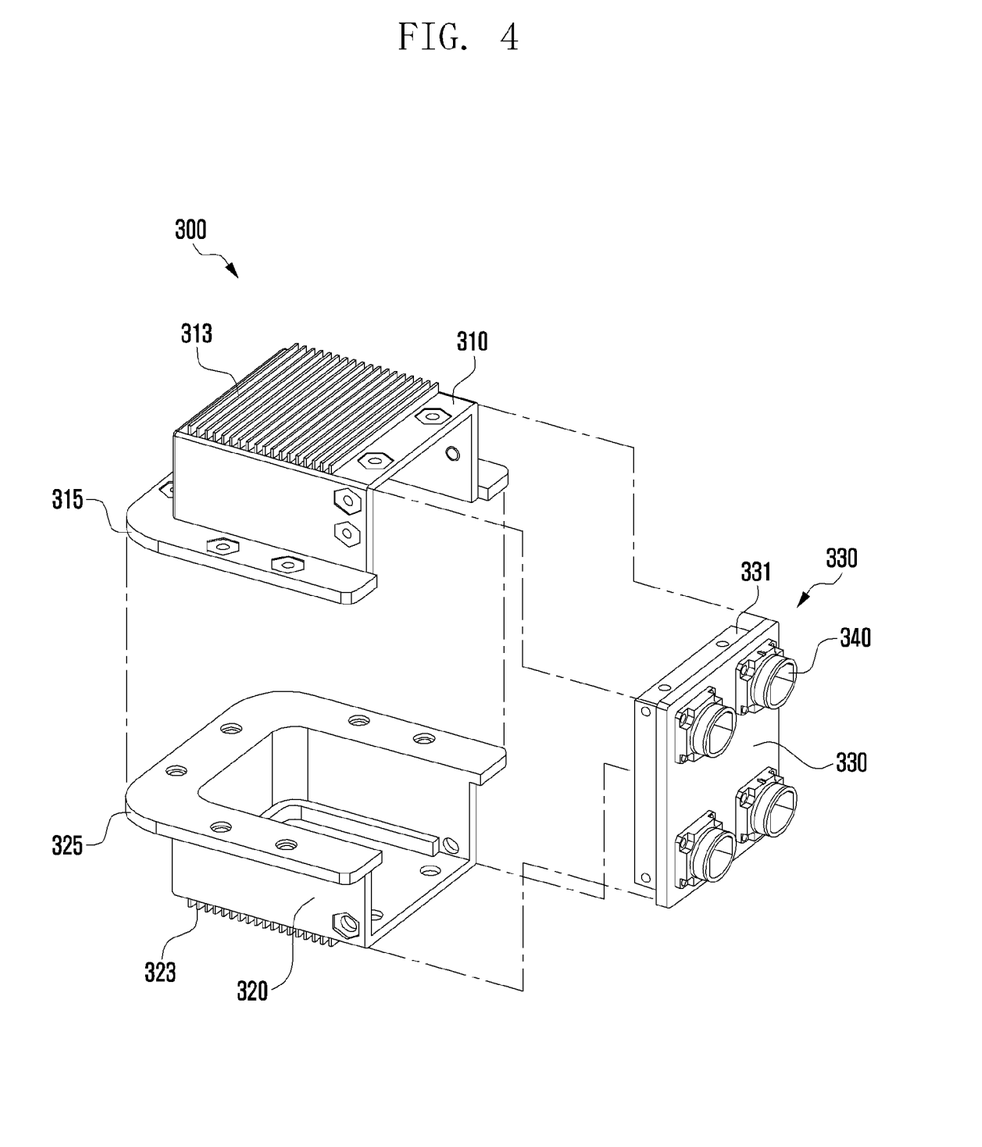
FIG. 4 is an exploded perspective view illustrating the communication device enclosure shown in FIG. 3.

In addition, FIG. 3 is a perspective view illustrating a communication device enclosure 300 of different materials according to another embodiment, and FIG. 4 is an exploded perspective view illustrating the communication device enclosure 300 shown in FIG. 3.

Hereinafter, in describing the communication device enclosures 100 and 300 according to embodiments, one embodiment shown in FIGS. 1 and 2 will be mainly described. Another embodiment shown in FIGS. 3 and 4 will be described only with respect to dissimilar portions.

The communication device enclosure 100 or 300 may be composed of a first housing 110 or 310, a second housing 120 or 320, and a connector cover 130 or 330. Each of the first housing 110 or 310 and the second housing 120 or 320 may be formed in a box shape and have two adjoining open faces, namely, one open face and one open lateral face adjacent thereto. The first housing 110 or 310 and the second housing 120 or 320 may be combined with each other such that a lower open face of the first housing 110 or 310 and an upper open face of the second housing 120 or 320 meet each other. Also, lateral open faces of the first and second housings look to the same direction.

The connector cover 130 or 330 may be disposed on the open lateral faces of the first housing 110 or 310 and the second housing 120 or 320. The connector cover 130 or 330 may be divided into two parts corresponding to the open lateral faces of the first and second housings 110 and 120 as shown in FIGS. 1 and 2, or may have an integrated form as shown in FIGS. 3 and 4.

Although the communication device enclosures 100 and 300 are illustrated as having a hexahedral box shape, any other shape that forms an inner space and contains an electronic component therein may be also applied.

In the communication device enclosure 100 or 300, the first housing 110 or 310, the second housing 120 or 320, and the connector cover 130 or 330 may be made of different materials. For example, the first housing 110 or 310 and the second housing 120 or 320 may be formed of magnesium, and the connector cover 130 or 330 may be formed of aluminum.

Magnesium is a lightweight material with a low specific gravity among metallic materials, for example, having a specific gravity of about 33% lower than aluminum. Also, the thermal conductivity of magnesium is as high as about 60 to 100 W/m·K, so that heat generated by the electronic component can be sufficiently dissipated to the outside when magnesium is used for the communication device enclosure. However, because of a high ionization tendency, magnesium has low corrosion resistance and may be susceptible to an external environment or galvanic corrosion due to contact of different metals.

In order to prevent the above problem, each of the first housing 110 or 310 and the second housing 120 or 320 may have a coating layer (111 of FIG. 6) formed on surfaces thereof. The coating layer is formed to prevent the surfaces of the first and second housings from being exposed directly, and may be formed through plasma electrolytic oxidation (PEO), coating film treatment, or any other suitable technique. In addition, the first housing 110 or 310 and the second housing 120 or 320 may have cooling fins 113 and 123 or 313 and 323 which are disposed on a face opposite to the open face so as to efficiently dissipate heat generated in the communication device enclosure 100 or 300.

Similarly, the connector cover 130 or 330 may have a coating layer (133 of FIG. 6) formed on surfaces thereof. The coating layer prevents the exposure of the connector cover 130 or 330 to an external environment, thereby improving corrosion resistance. Also, the connector cover 130 or 330 may have a first exposed portion where the coating layer is not formed. The first exposed portion may be formed around a connector hole into which a connector 140 or 340 is coupled. The first exposed portion is to offer a direct path for electric connection between the connector 140 or 340 and the communication device enclosure for purposes such as grounding of the connector or shielding of the electromagnetic wave.

If the communication device enclosure is formed of a single material such as magnesium, mutual contact between magnesium and the metallic connector 140 or 340 may accelerate the corrosion of magnesium.

Therefore, the communication device enclosure 100 or 300 includes the connector cover 130 or 330 separately, which is made of an aluminum-like material having high corrosion resistance. Then, the connector 140 or 340 is entirely disposed in the connector cover 130 or 330.

The contact of the connector cover 130 or 330 with the first housing 110 or 310 and the second housing 120 or 320 may cause galvanic corrosion. However, contrary to the connector 140 or 340, the first housing 110 or 310 and the second housing 120 or 320 do not need to be in direct contact with the connector cover 130 or 330. Therefore, as described above, each of the first housing 110 or 310 and the second housing 120 or 320 has the coating layer, which may block the direct contact.

In addition, a first flange 115 or 315 may be formed around the open face of the first housing 110 or 310, and also a second flange 125 or 325 may be formed around the open face of the second housing 120 or 320. Further, a first fastening unit 170 or 370 may be provided for the first flange 115 or 315 and the second flange 125 or 325 so as to combine the first housing 110 or 310 with the second housing 120 or 320 by a sufficient fastening force.

In addition, a protruding portion 131 or 331 may be formed on a certain face of the connector cover 130 or 330. The protruding portion 131 or 331 may be inserted into the open lateral face of the first and second housings 110 and 120 or 310 and 320 and then combined with the first and second housings 110 and 120 or 310 and 320. Further, a second fastening unit 180 or 380 may be provided to combine the protruding portion 131 or 331 with each of the first housing 110 or 310 and the second housing 120 or 320. The second fastening unit 180 or 380 may provide a sufficient fastening force between the connector cover 130 or 330 and each of the first housing 110 or 310 and the second housing 120 or 320.

The communication device enclosure is often installed outdoors and may be directly exposed to an external environment. However, the electronic component disposed in the communication device enclosure needs to have an environment of maintaining the homeostasis in order to ensure reliability of operation. Therefore, it may be important to seal the inner space of the communication device enclosure to block the influence of surrounding environments.

The communication device enclosure 100 or 300 made of different materials may reliably seal the inner space formed by the first housing 110 or 310, the second housing 120 or 320, and the connector cover 130 or 330 by providing a sufficient fastening force through the first and second fastening units 170 and 180 or 370 and 380. In addition, to seal the inner space more reliably, a gasket may be disposed at a portion where the first and second housings 110 and 120 or 310 and 320 and the connector cover 130 or 330 are combined with each other.

Figure 5:
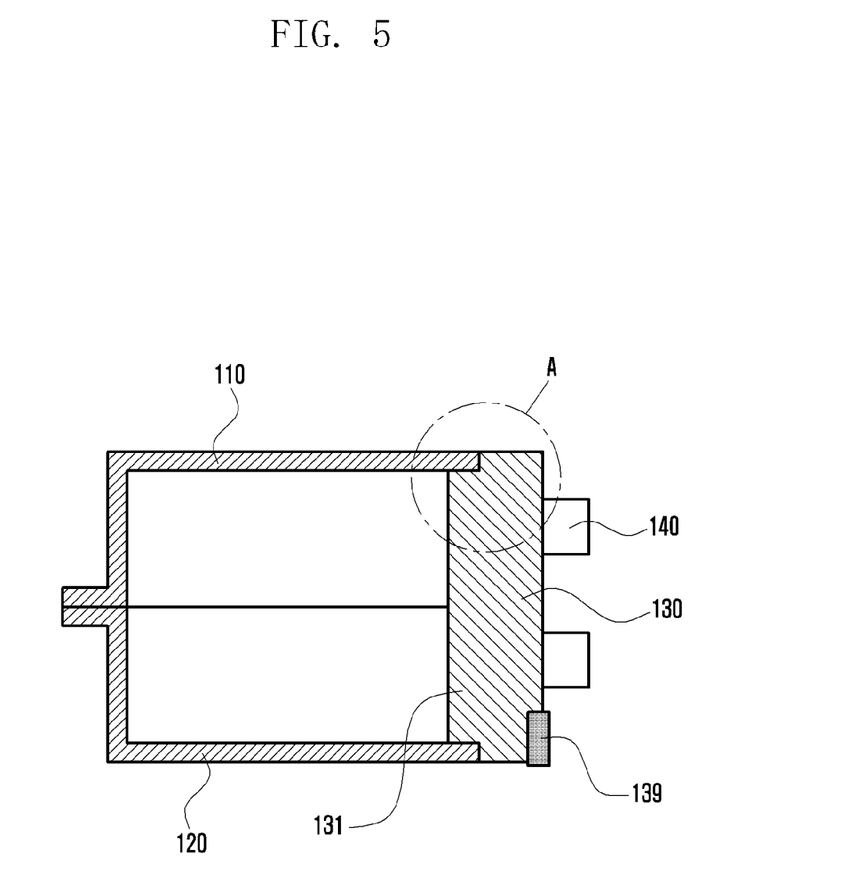
FIG. 5 is a schematic view illustrating a structure of a communication device enclosure of different materials according to an embodiment.
Figure 6:
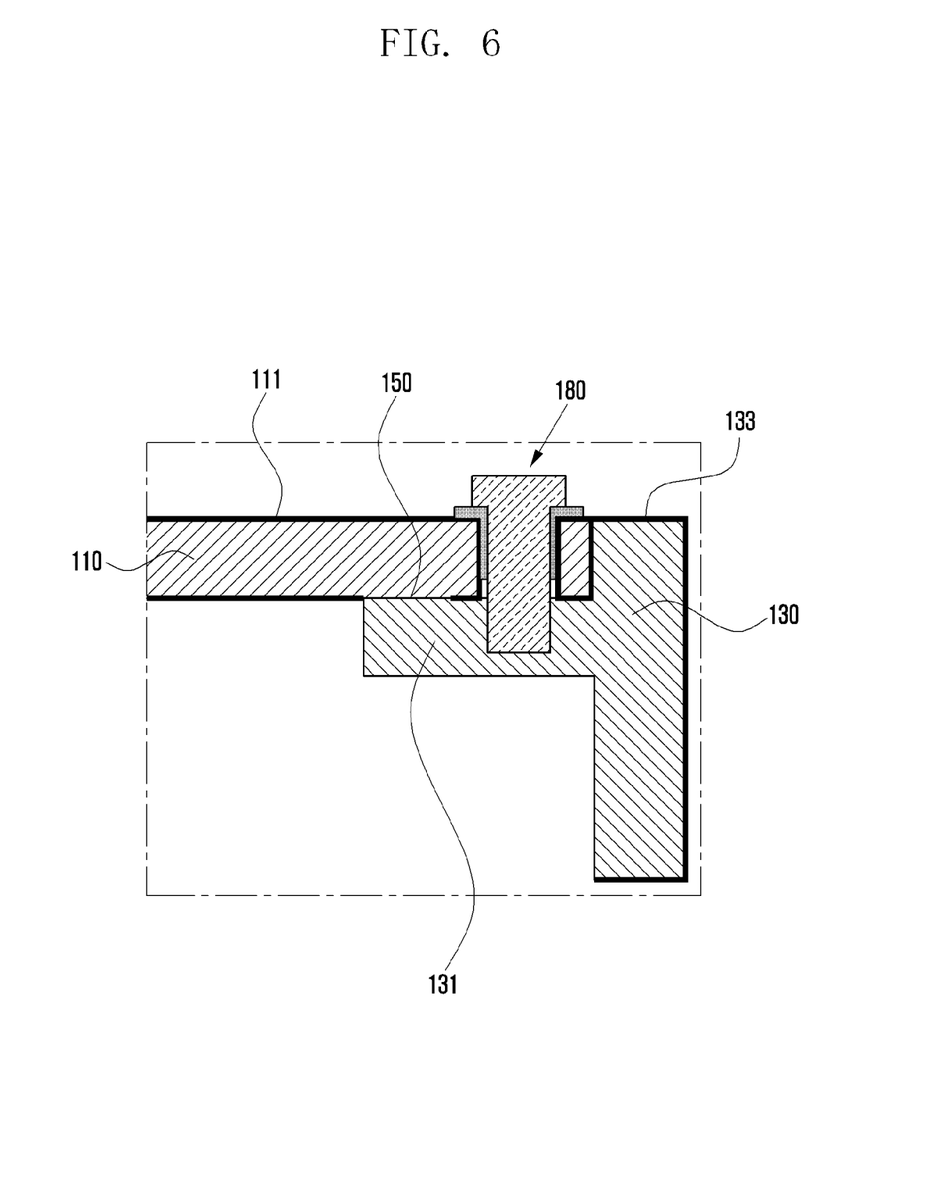
FIG. 6 is an enlarged view illustrating a joint portion between a first housing and a connector cover in the structure shown in FIG. 5.

FIG. 5 is a schematic view illustrating a structure of a communication device enclosure (e.g., 100 in FIG. 1) of different materials according to an embodiment, and FIG. 6 is an enlarged view illustrating a joint portion between a first housing 110 and a connector cover 130 in the structure shown in FIG. 5.

Referring to FIG. 5, the connector 140 may be disposed on one face of the connector cover 130, and a protruding portion 131 may be formed on the opposite face. As described above, the protruding portion 131 may be inserted into the open lateral faces of the first and second housings 110 and 120 and combined with the first and second housings 110 and 120. A grounding unit 139 may be disposed on a portion of the connector cover 130 so as to electrically connect the first housing 110, the second housing 120, and the connector cover 130 to a grounding area. The grounding unit 139 can prevent the electronic component from being damaged due to a short circuit that may occur from a cable connected to the connector 140, or protect the electronic component from a lightning strike or the like.

Referring to FIG. 6, a second exposed portion 150 having no coating layer may be disposed at a place where the first housing 110 and the connector cover 130 are in contact with each other. The second exposed portion 150 is to offer a direct path for electric connection between the first housing 110 and the connector cover 130.

The first housing 110 and the connector cover 130 are electrically connected through the second exposed portion 150, so that damage of the electronic component can be prevented through the grounding unit (139 of FIG. 5) even if an electric shock such as a lightning strike is applied to the communication device enclosure (100 of FIG. 1). Similarly, although not shown, the second exposed portion may be also disposed between the second housing 120 and the connector cover 130.

In this case, since the connector cover 130 formed of a metal different from those of the first and second housings 110 and 120 is directly in contact with the first and second housings 110 and 120, the corrosion resistance of the first and second housings 110 and 120 may be reduced due to galvanic corrosion. However, since the contact portion between the connector cover 130 and each of the first and second housings 110 and 120 is disposed inside the communication device enclosure (100 of FIG. 1), the contact portion may be blocked from any unfavorable factor such as moisture that causes corrosion. It is therefore possible to suppress a reduction in the corrosion resistance of the first and second housings 110 and 120.

FIGS. 7 to 10 are views illustrating a fastening unit of a communication device enclosure (e.g., 100 in FIG. 1) of different materials according to various embodiments.

Figure 7:
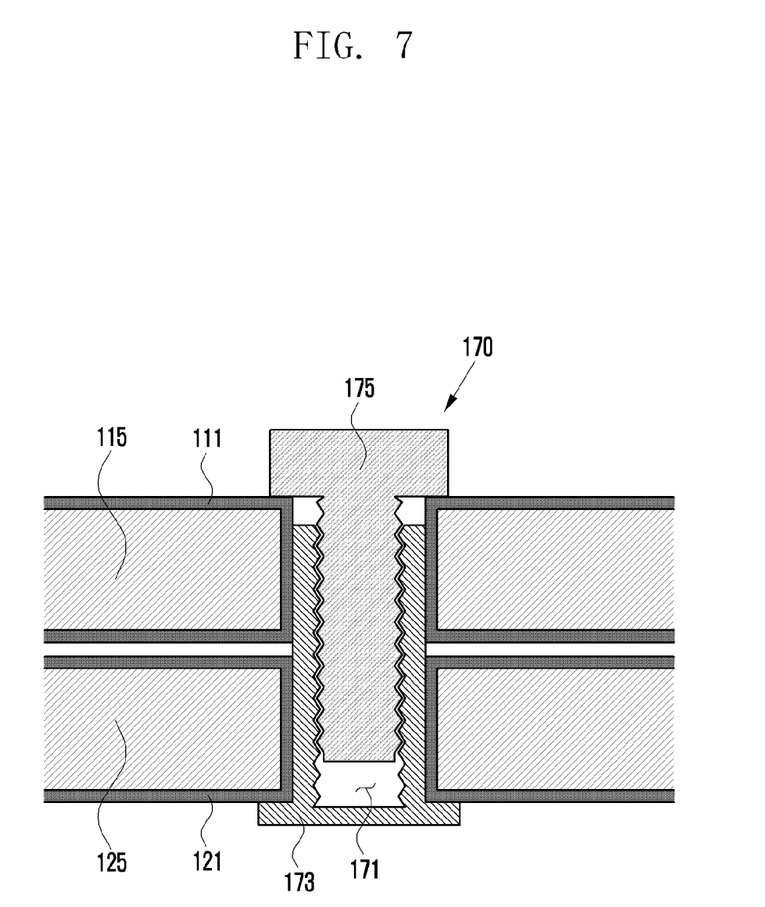
FIGS. 7 to 10 are views illustrating a fastening unit of a communication device enclosure of different materials according to various embodiments.

The first fastening unit 170 of the communication device enclosure (100 of FIG. 1) may include a fastening hole 171, a fastening member 173, and a bolt 175. The fastening hole 171 may be formed through the first flange 115 and the second flange 125. The fastening member 173 may be formed in a tubular shape and may have a thread on an inner surface thereof. An outer diameter of the fastening member 173 is smaller than the diameter of the fastening hole 171 so that the fastening member 173 can be inserted into the fastening hole 171. In addition, a flange may be formed at one end of the fastening member 173 so that the fastening member 173 cannot completely pass through the fastening hole 171. The bolt 175 may be engaged with the thread of the fastening member 173 to combine the first and second housings (110 and 120 of FIG. 1) with each other.

In the communication device enclosure (100 of FIG. 1), the fastening member 173 may be separately used in a process of inserting the bolt 175 into the fastening hole 171 so as to prevent the direct contact between the bolt 175 and each housing which are made of different materials.

The fastening member 173 may become nonconductive through a separate coating process or treatment. When the nonconductive fastening member 173 is disposed in the fastening hole 171 to prevent the direct contact between the bolt 175 and each housing, it is possible to prevent galvanic corrosion due to contact of different material. The coating process or treatment of the fastening member 173 may use anodizing, for example.

The length of the fastening member 173 is greater than the thickness of each of the first and second flanges 115 and 125 and may be smaller than the sum of the thicknesses of the first and second flanges 115 and 125. If the length of the fastening member 173 is smaller than the thickness of each of the first and second flanges 115 and 125 in a process of assembling the bolt 175 and the fastening member 173, the first and second flanges 115 and 125 may not be completely combined with each other and thus slip off, which may lead to damage of the surface coating and deterioration of corrosion resistance. Further, if the length of the fastening member 173 is greater than the thickness of each of the first and second flanges 115 and 125, the bolt 175 may fail to combine the first and second housings (110 and 120 of FIG. 1) with each other, and the inner space of the communication device enclosure may not be sealed.

Figure 8:
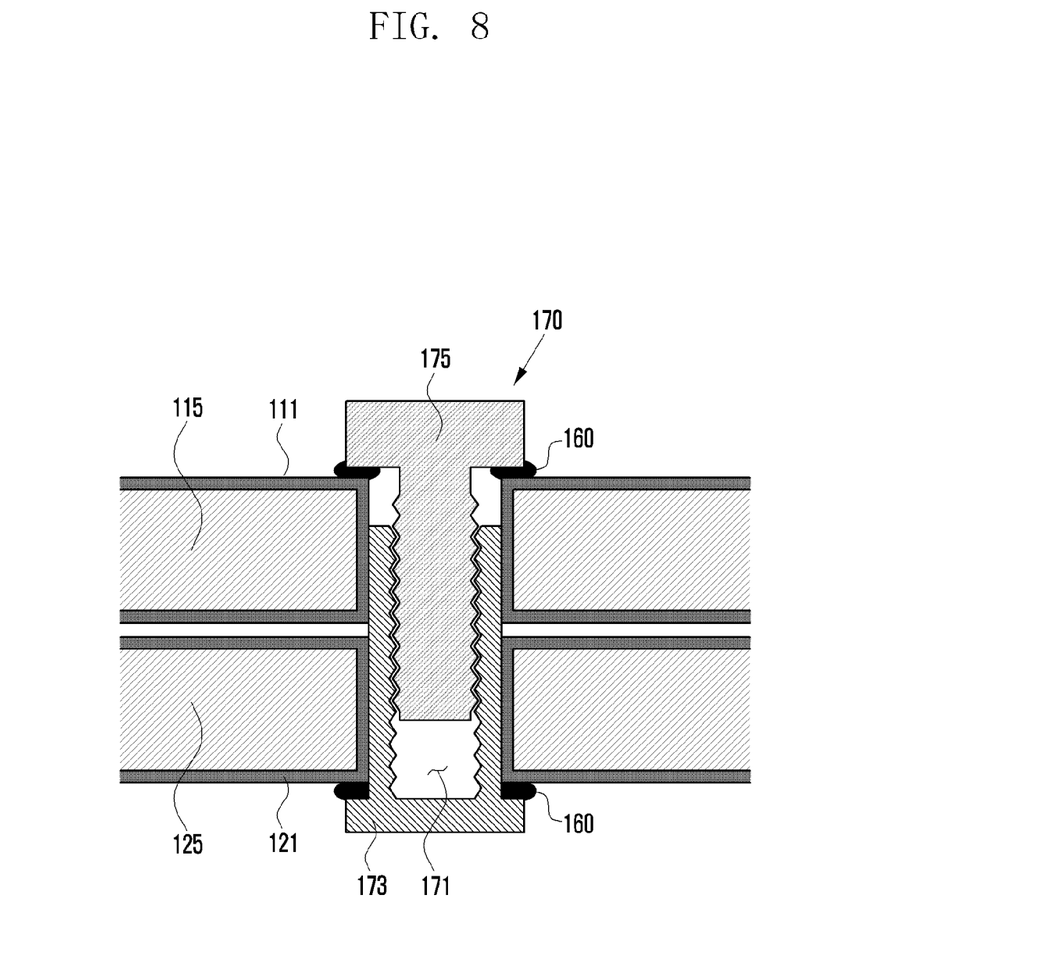

Referring to FIG. 8, an insulating washer 160 may be disposed between the bolt 175 and the first flange 115.

Similarly, the insulating washer 160 may be disposed between the flange of the fastening member 173 and the second flange 125. If all of the first and second flanges 115 and 125, the bolt 175, and the fastening member 173 are coated, it is possible to prevent direct contact between them and thus prevent the risk of galvanic corrosion. Nevertheless, by further disposing the insulating washer 160, it may block the inflow of moisture between the bolt 175 and the first flange 115 and between the fastening member 173 and the second flange 125. Further, the insulating washer 160 may prevent any damage of the coating layer due to friction during a process of combining or separating the bolt 175 and the fastening member 173.

Figure 9:
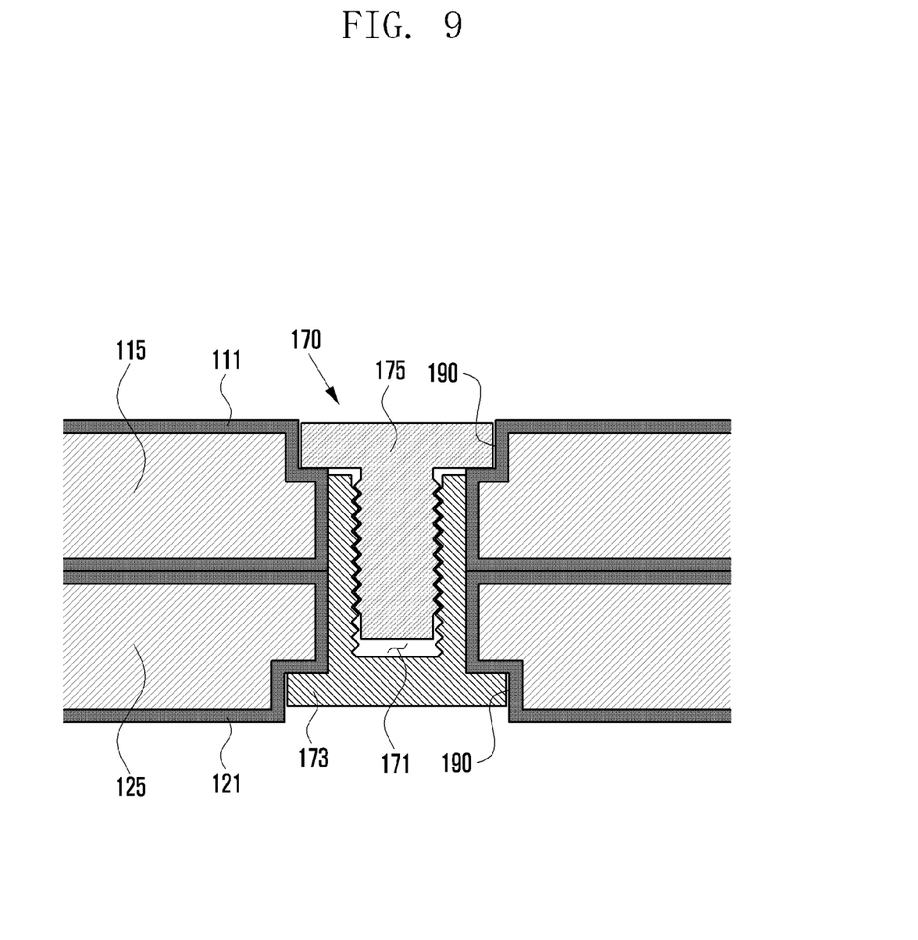

Referring to FIG. 9, each of the first and second flanges 115 and 125 may have a chamfered edge 190 which conforms to a head shape of the bolt 175 or a flange shape of the fastening member 173. The chamfered edge 190 may remove protrusions, give a better appearance, and prevent any unnecessary external impact from concentrating on the joint portion.

In addition, if the flange of the fastening member 173 and the chamfered edge 190 are formed in a polygonal shape, both may be fixed in shape and allow the bolt 175 to be easily fastened or separated. Also, it is possible to prevent the fastening member 173 from slipping and damaging the surface coating of the first and second flanges 115 and 125 in a process of fastening the bolt 175.

Figure 10:
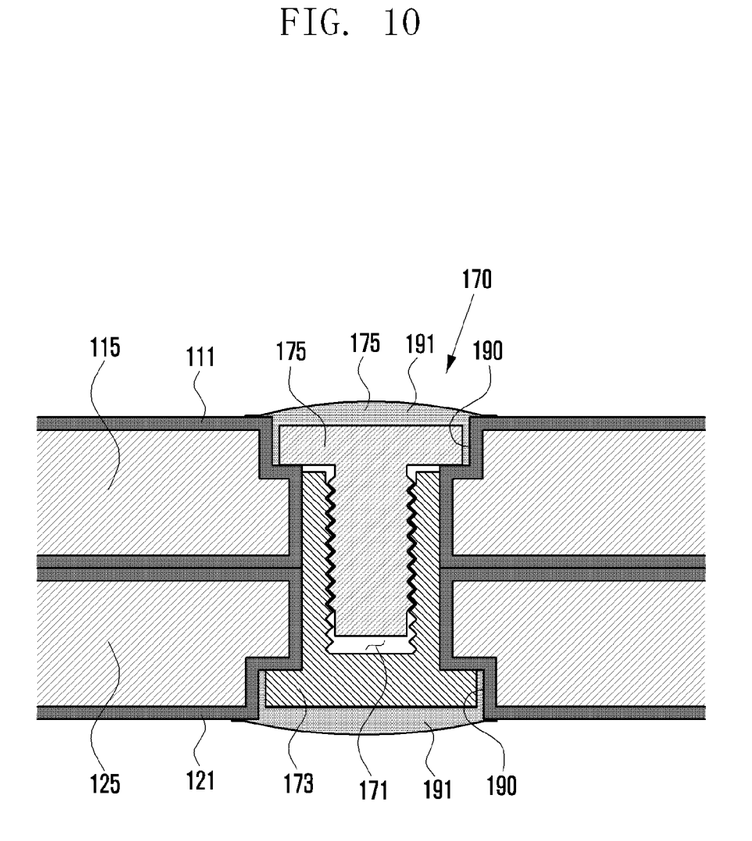

Referring to FIG. 10, a sealing cap 191 having a shape corresponding to the chamfered edge 190 may cover the head of the bolt 175 or the flange of the fastening member 173. By blocking the inflow of moisture through the sealing cap 191, it is possible to prevent corrosion due to moisture.

According to various embodiments of this disclosure, a communication device enclosure made of different materials may include a first housing formed in a box shape and having one open face and one open lateral face adjacent to the one open face; a second housing formed in a box shape and having one open face and one open lateral face adjacent to the one open face, wherein the first and second housings form together an inner space for containing an electronic component; and a connector cover formed of a material different from materials of the first and second housings, disposed on the open lateral faces of the first and second housings, and having a connector for electric connection between the electronic component and an external device, wherein the connector cover is combined with the first and second housings to seal the inner space.

Each of the first and second housings may be formed of magnesium and have a coating layer formed on a surface thereof.

Each of the first and second housings may have cooling fins disposed on a face opposite to the open face.

The connector cover may have a coating layer formed on a surface thereof, a connector hole for accommodating the connector, and a first exposed portion formed for direct contact between the connector and the connector cover around the connector hole.

Each of the first and second housings and the connector cover may have a second exposed portion disposed at a contact place between the first housing and the connector cover and at a contact place between the second housing and the connector cover.

The communication device enclosure may further include a grounding unit disposed on the connector cover to electrically connect the first and second housings and the connector cover to a grounding area.

The communication device enclosure may further include a gasket disposed for sealing at a portion where the first and second housings and the connector cover are combined with each other.

The communication device enclosure may further include a first flange formed around the open face of the first housing; a second flange formed around the open face of the second housing; and a first fastening unit formed through the first and second flanges.

The communication device enclosure may further include a protruding portion formed on one face of the connector cover and inserted into the open lateral face of the first and second housings; and a second fastening unit formed through the first housing and the protruding portion or through the second housing and the protruding portion.

The first fastening unit may include a fastening hole formed through the first flange and the second flange; a fastening member formed in a tubular shape, having a thread on an inner surface thereof, having an outer diameter smaller than a diameter of the fastening hole, and a flange formed at one end thereof; and a bolt engaged with the thread of the fastening member.

A length of the fastening member may be greater than a thickness of each of the first and second flanges and be smaller than a sum of thicknesses of the first and second flanges.

The communication device enclosure may further include an insulating washer disposed between the bolt and the first flange and between the flange of the fastening member and the second flange.

Each of the first and second flanges may have a chamfered edge which conforms to a head shape of the bolt or a flange shape of the fastening member.

The communication device enclosure may further include a sealing cap having a shape corresponding to the chamfered edge and covering a head of the bolt or the flange of the fastening member.

Although the present disclosure has been described with various embodiments, various changes and modifications may be suggested to one skilled in the art. It is intended that the present disclosure encompass such changes and modifications as fall within the scope of the appended claims.

What is claimed is:

1. A communication device enclosure made of different materials, the communication device enclosure comprising:
 a first housing formed in a box shape and comprising one open face and one open lateral face adjacent to the one open face;
 a second housing formed in a box shape and comprising one open face and one open lateral face adjacent to the one open face, wherein the first and second housings form together an inner space for containing an electronic component;
 a connector cover, wherein the connector cover:
  is formed of a material different from materials of the first and second housings,
  is disposed on the open lateral faces of the first and second housings, and
  comprises a connector configured for electric connection between the electronic component and an external device, and is combined with the first and second housings to seal the inner space,
 a first fastening unit formed through a first flange formed around the open face of the first housing and a second flange formed around the open face of the second housing, wherein the first fastening unit includes:
a fastening hole formed through the first flange and the second flange;
a fastening member formed in a tubular shape with an outer diameter smaller than a diameter of the fastening hole, comprising a thread on an inner surface thereof, and a flange formed at one end thereof; and
a bolt engaged with the thread of the fastening member; and
a first insulating washer disposed between the bolt and the first flange, and a second insulating waster disposed between the flange of the fastening member and the second flange,
wherein each of the first housing, the second housing, and the connector cover comprises a coating layer formed on a surface thereof,
wherein the first housing is electrically connected to the connector cover via at least one first contact portion where the first housing and the connector cover are physically contacted and the coating layer is uncoated,
wherein the second housing is electrically connected to the connector cover via at least one second contact portion where the second housing and the connector cover are physically contacted and the coating layer is uncoated, and
wherein the first housing and the second housing are electrically connected via the connector cover.

2. The communication device enclosure of claim 1, wherein each of the first and second housings comprises cooling fins disposed on a face opposite to the open face.

3. The communication device enclosure of claim 1, wherein the connector cover further comprises a connector hole configured to accommodate the connector, and an exposed portion configured to allow direct contact between the connector and the connector cover around the connector hole.

4. The communication device enclosure of claim 1, further comprising:
a grounding unit disposed on the connector cover and configured to electrically connect the first and second housings and the connector cover to a grounding area.

5. The communication device enclosure of claim 1, further comprising:
a gasket configured to seal a portion where the first and second housings and the connector cover are combined with each other.

6. The communication device enclosure of claim 1, further comprising:
a protruding portion formed on one face of the connector cover and inserted into the open lateral face of the first and second housings; and
a second fastening unit formed (i) through the first housing and the protruding portion or (ii) through the second housing and the protruding portion.

7. The communication device enclosure of claim 1, wherein a length of the fastening member is (i) greater than a thickness of each of the first and second flanges and (ii) smaller than a sum of thicknesses of the first and second flanges.

8. The communication device enclosure of claim 1, wherein each of the first and second flanges include a chamfered edge configured to conform to a head shape of the bolt or a flange shape of the fastening member.

9. The communication device enclosure of claim 8, further comprising:
a sealing cap comprising a shape corresponding to the chamfered edge and configured to cover a head of the bolt or the flange of the fastening member.

10. The communication device enclosure of claim 1, further comprising:
a grounding unit disposed on the connector cover and configured to electrically connect the first and second housings and the connector cover to a grounding area.

11. The communication device enclosure of claim 1, wherein each of the first and second flanges include a chamfered edge.

12. The communication device enclosure of claim 11, further comprising:
a sealing cap comprising a shape corresponding to the chamfered edge.

13. The communication device enclosure of claim 1, further comprising:
a sealing cap configured to cover a head of the bolt or the flange of the fastening member.

* * * * *